(12) United States Patent
Redeker et al.

(10) Patent No.: US 6,796,880 B2
(45) Date of Patent: *Sep. 28, 2004

(54) LINEAR POLISHING SHEET WITH WINDOW

(75) Inventors: Fred C. Redeker, Fremont, CA (US); Manoocher Birang, Los Gatos, CA (US); Shijian Li, San Jose, CA (US); Sasson Somekh, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/394,599

(22) Filed: Mar. 21, 2003

(65) Prior Publication Data

US 2003/0181137 A1 Sep. 25, 2003

Related U.S. Application Data

(63) Continuation of application No. 09/724,846, filed on Nov. 28, 2000, now Pat. No. 6,585,563, which is a continuation of application No. 09/244,816, filed on Feb. 4, 1999, now Pat. No. 6,179,709.

(51) Int. Cl.[7] .............................................. B24B 1/00
(52) U.S. Cl. .......................... 451/6; 451/41; 451/168; 451/288; 451/296
(58) Field of Search ................... 451/6, 41, 168, 451/285–289, 296, 528

(56) References Cited

U.S. PATENT DOCUMENTS

| | | |
|---|---|---|
| 3,888,050 A | 6/1975 | Elm |
| 4,676,029 A | 6/1987 | Palmer |
| 5,016,400 A | 5/1991 | Weber |
| 5,081,796 A | 1/1992 | Schultz |
| 5,127,196 A | 7/1992 | Morimoto et al. |
| 5,413,941 A | 5/1995 | Koos et al. |
| 5,433,651 A | 7/1995 | Lustig et al. |
| 5,484,323 A | 1/1996 | Smith |
| 5,489,233 A | 2/1996 | Cook et al. |
| 5,558,568 A | 9/1996 | Talieh et al. |
| 5,562,524 A | 10/1996 | Gill, Jr. |
| 5,575,707 A | 11/1996 | Talieh et al. |
| 5,593,344 A | 1/1997 | Weldon et al. |
| 5,597,341 A | 1/1997 | Kodera et al. |
| 5,605,760 A | 2/1997 | Roberts |
| 5,640,242 A | 6/1997 | O'Boyle et al. |
| 5,643,046 A | 7/1997 | Katakabe et al. |
| 5,672,091 A | 9/1997 | Takahashi et al. |
| 5,692,947 A | 12/1997 | Talieh et al. |
| 5,722,875 A | 3/1998 | Iwashita et al. |
| 5,722,877 A | 3/1998 | Meyer et al. |
| 5,747,385 A | 5/1998 | Torii |
| 5,762,536 A | 6/1998 | Pant et al. |

(List continued on next page.)

FOREIGN PATENT DOCUMENTS

| | | |
|---|---|---|
| EP | 0 738 561 A1 | 10/1996 |
| EP | 0 824 995 A1 | 2/1998 |
| EP | 0 841 122 A1 | 5/1998 |
| EP | 0 881 040 A2 | 12/1998 |
| EP | 0 881 484 A2 | 12/1998 |
| JP | 3-234467 | 10/1991 |
| JP | 111-256 | 4/1995 |
| WO | WO 97/20660 | 6/1997 |

*Primary Examiner*—George Nguyen
(74) *Attorney, Agent, or Firm*—Fish & Richardson

(57) ABSTRACT

A polishing article for chemical mechanical polishing. The polishing article includes a generally elongated polishing sheet with a polishing surface. The polishing article is formed from a material that is substantially opaque, and has a discrete region extending substantially the length of the polishing sheet that is at least semi-transparent.

22 Claims, 4 Drawing Sheets

U.S. PATENT DOCUMENTS

| | | |
|---|---|---|
| 5,791,969 A | 8/1998 | Lund |
| 5,800,248 A | 9/1998 | Pant et al. |
| 5,803,799 A | 9/1998 | Volodarsky et al. |
| 5,838,447 A | 11/1998 | Hiyama et al. |
| 5,846,882 A | 12/1998 | Birang |
| 5,872,633 A | 2/1999 | Holzapfel et al. |
| 5,888,119 A | 3/1999 | Christianson et al. |
| 5,893,796 A | 4/1999 | Birang et al. |
| 5,949,927 A | 9/1999 | Tang |
| 5,961,372 A | 10/1999 | Shendon |
| 5,964,643 A | 10/1999 | Birang et al. |
| 6,179,709 B1 * | 1/2001 | Redeker et al. ............ 451/6 |
| 6,585,563 B1 * | 7/2003 | Redeker et al. ............ 451/6 |

* cited by examiner

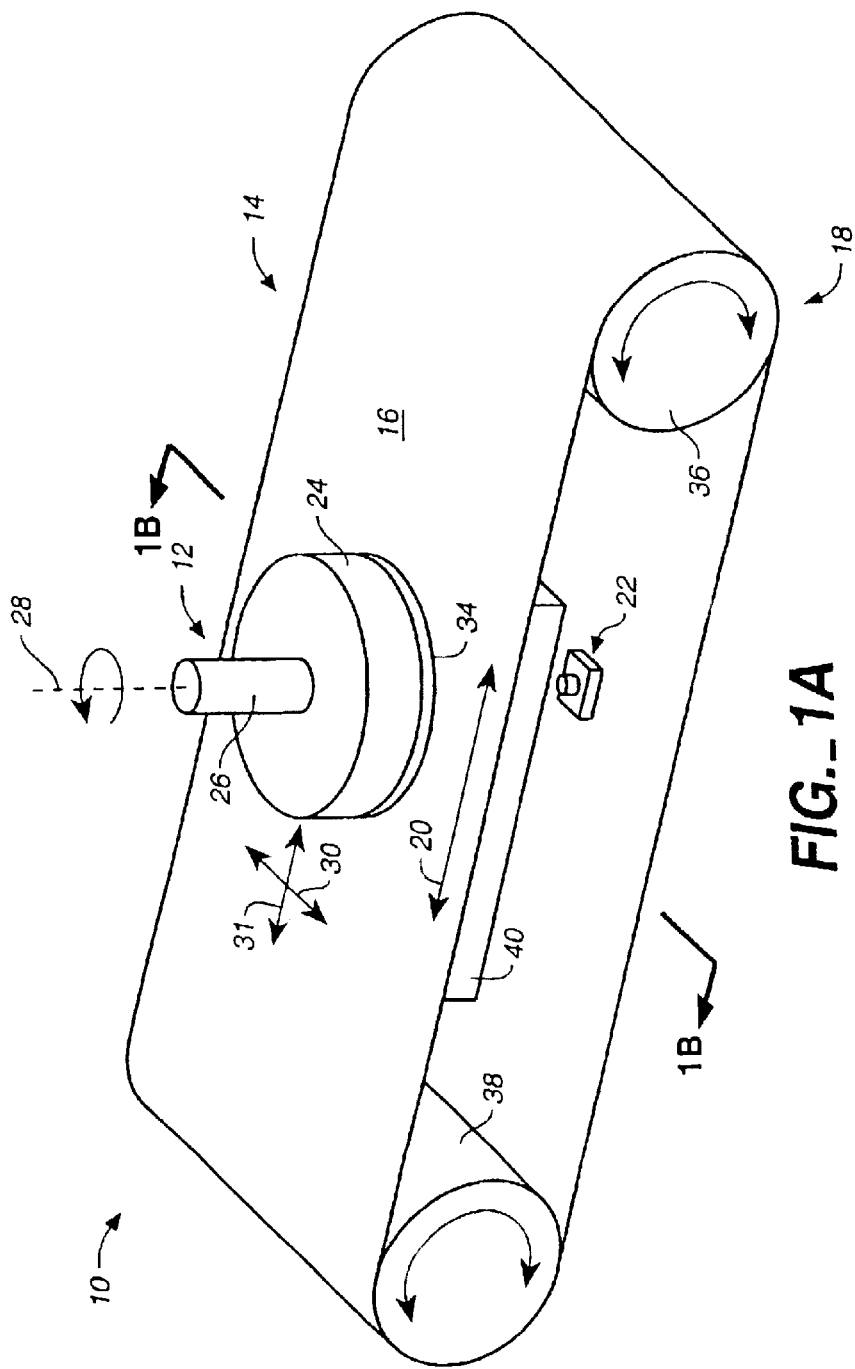
FIG._1A

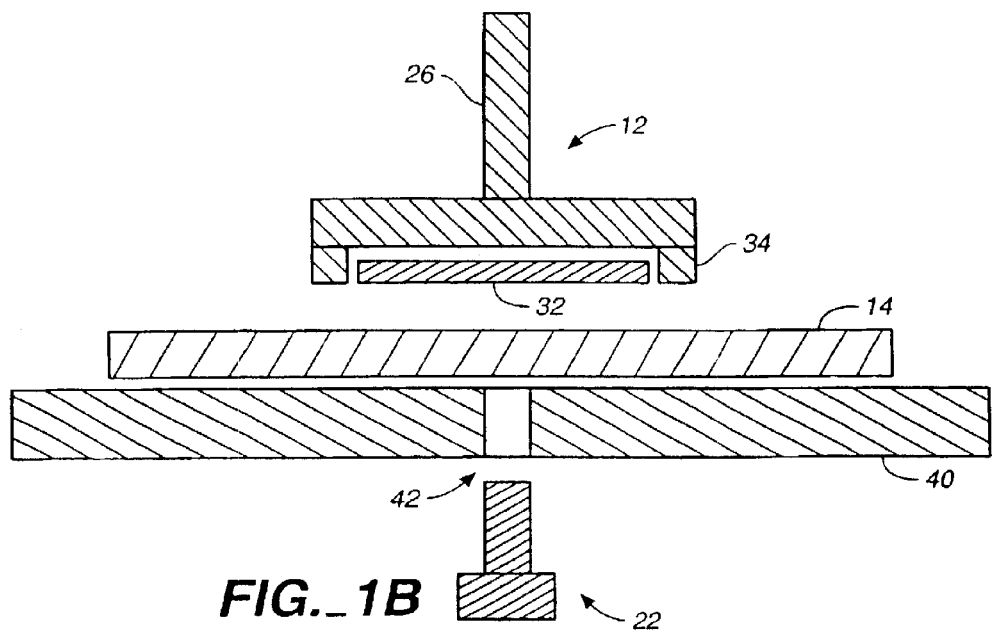
FIG._1B
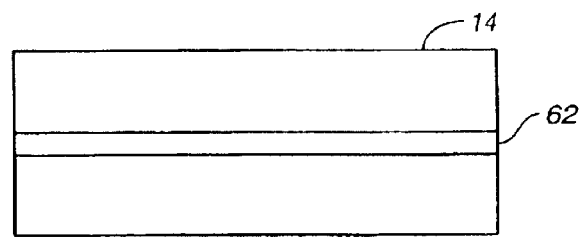
FIG._3B
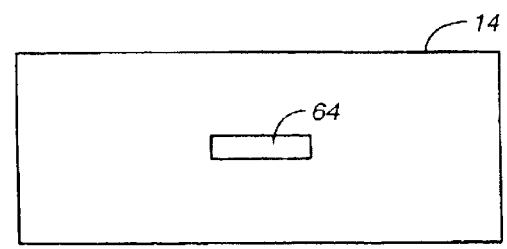
FIG._3C

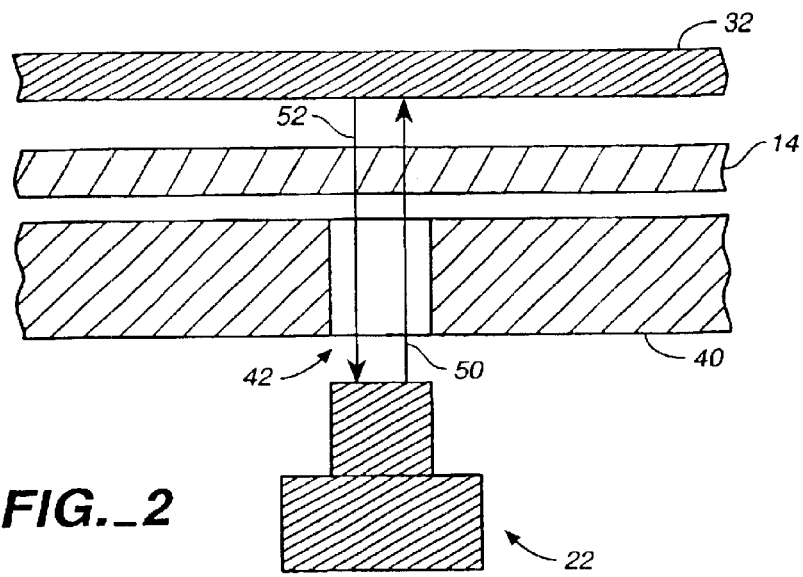
FIG._2
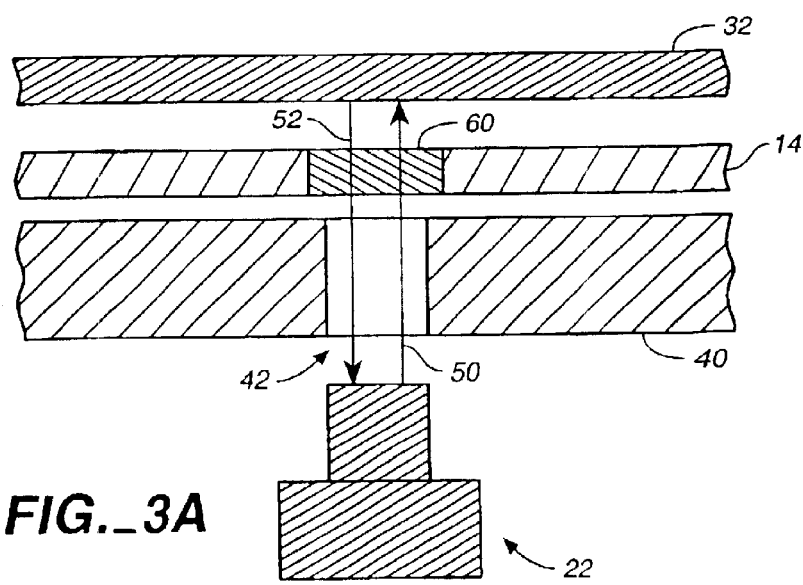
FIG._3A

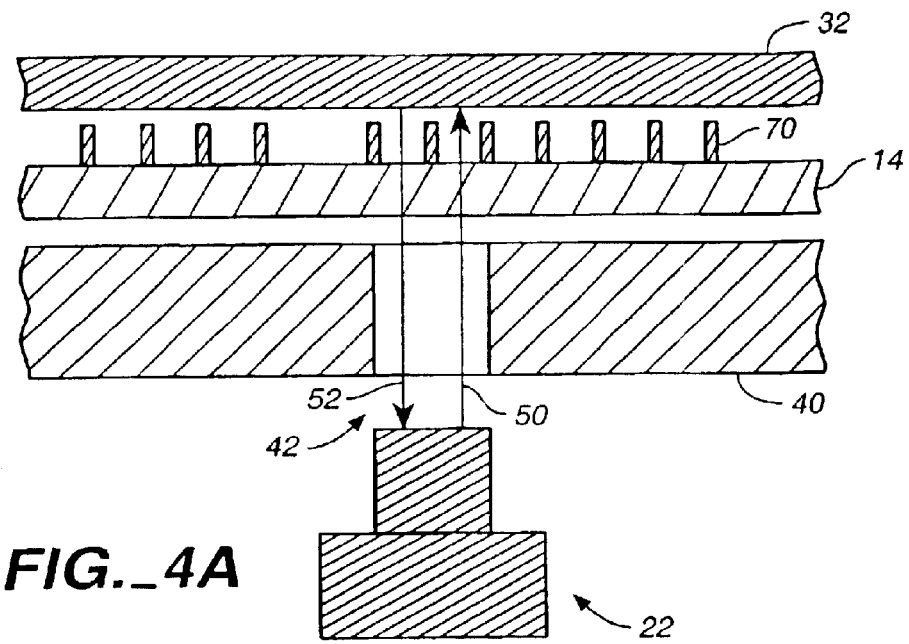
FIG._4A
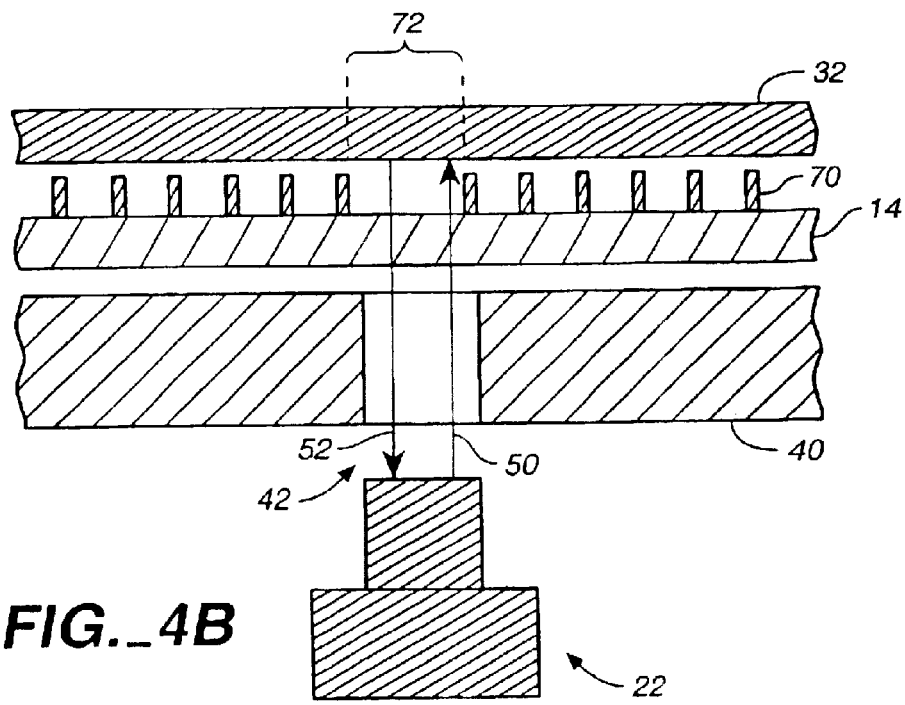
FIG._4B

LINEAR POLISHING SHEET WITH WINDOW

CROSS REFERENCE TO RELATED CASES

This application is a continuation and claims priority under 35 USC 120 to U.S. application Ser. No. 09/724,846, filed Nov. 28, 2000 now U.S. Pat. No. 6,585,563, which is a continuation of U.S. application Ser. No. 09/244,816, filed Feb. 4, 1999, now U.S. Pat. No. 6,179,709, the entirety of which are incorporated herein by reference.

BACKGROUND

The invention relates to linear polishing, and more particularly to in-situ monitoring of linear substrate polishing operations.

It is always desirable to monitor polishing operations in-situ. For example, during chemical mechanical polishing operations, it is desirable to determine the point (end point) when a substrate layer has been polished to a desired thickness because the polishing rate may vary over time. Chemical mechanical polishing is a process by which a substrate surface is smoothed (planarized) to a substantially uniform level by a polishing pad and an abrasive slurry. A substrate to be polished is usually mounted on a rotatable carrier head and pressed against a moving polishing pad. The polishing pad typically consists of an abrasive sheet. An abrasive chemical solution (slurry) may be introduced onto the polishing pad to assist in the polishing process.

SUMMARY

The invention features a substrate polishing scheme (apparatus and method) according to which a polishing surface of a polishing sheet is driven in a generally linear direction by a drive mechanism, a surface of a substrate is held against the polishing surface of the polishing sheet by a polishing head, and the substrate is probed through the polishing sheet by a monitoring system.

Embodiments may include one or more of the following features.

In one embodiment, the monitoring system comprises a light source configured to produce light and to direct the light through the polishing sheet to the substrate, and a detector configured to detect light reflecting from the substrate. In this embodiment, the polishing sheet includes a region that is at least semi-transparent with respect to the light produced by the light source. The polishing sheet may be formed from material that is at least semi-transparent with respect to the light produced by the light source. Alternatively, the polishing sheet may formed from material that is substantially opaque with respect to the light produced by the light source, and the polishing sheet may include a discrete region that is at least semi-transparent with respect to the light produced by the light source. The discrete region may extend substantially the length of the polishing sheet, or may extend only a limited length of the polishing sheet.

In another embodiment, the polishing surface of the polishing sheet comprises a plurality of projecting surface features. The surface features may be disposed across the polishing surface with a substantially uniform spacing between adjacent surface features, and the surface features may be sufficiently transmissive for the monitoring system to probe the substrate. Alternatively, the surface features may be disposed across the polishing surface with a substantially uniform spacing between adjacent surface features, except for a probe region of the polishing surface where the spacing between adjacent surface features is greater than the spacing at other locations to enable the monitoring system to probe the substrate.

The monitoring system may be configured to operate in coordination with the polishing head and the drive mechanism to periodically probe the substrate. A rotation mechanism may be provided to rotate the linear drive mechanism in a plane relative to the substrate.

Other features and advantages will become apparent from the following description, including the drawings and the claims.

BRIEF DESCRIPTION OF THE DRAWINGS

FIGS. 1A and 1B are a diagrammatic perspective view and a diagrammatic cross-sectional side view, respectively, of a linear substrate polishing apparatus that includes a system for monitoring polishing operations in-situ.

FIG. 2 is a diagrammatic cross-sectional side view of a portion of the linear substrate polishing apparatus of FIGS. 1A and 1B.

FIG. 3A is a diagrammatic cross-sectional side view of a portion of a linear substrate polishing apparatus that includes a linear polishing sheet with a light-transmissive region.

FIG. 3B is a diagrammatic top view of a linear polishing sheet with an elongated light-transmissive region that extends along the length of the polishing sheet.

FIG. 3C is a diagrammatic top view of a linear polishing sheet with a discrete light-transmissive region.

FIGS. 4A and 4B are diagrammatic cross-sectional side views of portions of linear substrate polishing apparatus that include different linear polishing sheets each having a plurality of surface polishing features.

DETAILED DESCRIPTION

Referring to FIGS. 1A and 1B, a linear substrate polishing apparatus 10 includes a polishing head 12, a polishing sheet 14 which has a polishing surface 16, a linear drive mechanism 18 which is configured to drive polishing surface 16 in a generally linear direction 20, and a monitoring system 22.

Polishing head 12 includes a substrate support 24 coupled to a shaft 26 for rotating substrate support 24 about an axis 28. Substrate support 24 also may be translated across the surface of polishing sheet 14 along the longitudinal directions indicated by double-headed arrows 30, 31, or a combination of these directions to achieve a circular or elliptical translation path. Polishing head 12 also may be moved close to and away from polishing surface 16 by a cantilevered arm or a pneumatically-controlled support arm (not shown). Polishing head 12 includes a mechanism for retaining a substrate 32, as U.S. Pat. No. 5,961,372, which is incorporated herein by reference. In another embodiment, polishing head 12 may include a flexible sheet that provides a mounting surface for substrate 32. Pressurization of a chamber defined by the flexible sheet forces the substrate against the polishing pad. A description of a similar polishing head may be found in U.S. Pat. No. 6,183,354, which is incorporated herein by reference.

Linear drive mechanism 18 is configured to drive polishing surface 16 of polishing sheet 14 in a generally linear direction relative to substrate 32. That is, linear drive mechanism 18 is configured to move any point on polishing surface 16 in a plane that is substantially parallel to the substrate surface to be polished and along a generally straight path relative to the instantaneous position of substrate 32. In the embodiment of FIGS. 1A and 1B, linear drive mechanism 18 includes two rollers 36, 38 which engage polishing sheet 14 to drive polishing surface 16 along a linear path 20. The movement of polishing surface 16 may consist of movement in one direction, or it may consist of incremental, back-and-forth movement along path 20. Rollers 36, 38 may be oriented horizontally or vertically so long as they are configured to drive polishing surface 16 in a generally linear direction relative to the substrate surface to be polished. In one embodiment, rollers 36, 38 may be mounted on a platform configured to rotate rollers 36, 38, as a pair, so that polishing surface 16 is simultaneously rotated and driven linearly in a plane relative to substrate 32, as described in U.S. Pat. No. 6,244,935, which is incorporated herein by reference.

Polishing sheet 14 may be formed from various materials. For example, one two-layer polishing sheet includes a covering layer composed of an open-cell foamed polyurethane, or a polyurethane sheet with a grooved surface, and a backing layer composed of compressed felt fibers leached with urethane. The slurry may also include abrasive particles (e.g., silicon dioxide for oxide polishing). A polishing sheet conditioner may be provided to maintain the condition of polishing surface 16 over time.

A backing plate 40 is disposed adjacent to polishing sheet 14 at a location that is directly opposed to the location of the region over which polishing head 12 is swept across polishing surface 16. Polishing sheet 14 is sandwiched between polishing head 12 and backing plate 40. As polishing surface 16 moves along linear path 20, backing plate 40 supports the underside of polishing sheet 14 so that polishing surface 16 abrades the surface of substrate 32 with a substantially uniform pressure. Backing plate 40 defines a transparent window (or simply a hole) 42 that allows monitoring system 22 to probe substrate 32 through polishing sheet 14. Window 42 is positioned such that it has a view of substrate 32. Monitoring system 22 includes a laser which directs a probing beam of laser light (e.g., with a wavelength of about 670 nm) toward substrate 32 through window 42 and polishing sheet 14, and a detector which detects light reflecting from substrate 32. As described in detail below, polishing sheet 14 includes a region that is at least semi-transparent with respect to the light produced by monitoring system 22. Monitoring system 22 is configured to determine the amount of material removed from the surface of substrate 32, or to determine the end point of a polishing process, as described in U.S. Pat. No. 5,964,643, which is incorporated herein by reference.

Referring to FIG. 2, in one embodiment, polishing sheet 14 is formed from a material (e.g., polyurethane) that is at least semi-transparent (substantially transmissive) with respect to the light produced by monitoring system 22. In operation, monitoring system 22 produces a laser beam 50, at least a portion of which passes through window 42 and polishing sheet 14. The portion of beam 50 which impinges on substrate 32 is partially reflected from one or more layers of substrate 32 to produce a beam 52 which has an intensity that varies as layers are removed from substrate 32. For example, if the surface layer is partially reflective and partially transmissive, beam 52 will be formed from at least two beams reflecting from different surfaces and the intensity of beam 52 will vary depending on whether the constituent beams interfere constructively or destructively, a characteristic which is primarily a function of the thickness of the surface layer. If the surface layer is substantially reflective, the intensity of beam 52 will be significantly reduced when the surface layer has been polished away.

Monitoring system 22 monitors the variation in the intensity of beam 52 during a polishing process to determine the amount of material that has been removed from the surface of substrate 32, or to determine the end point of the polishing process. The operation of monitoring system 22 is coordinated with the movement of substrate support 24 to enable monitoring system 22 to periodically probe substrate 32. In particular, monitoring system 22 is configured to trigger the laser when substrate 32 is positioned over window 42; alternatively, monitoring system 22 may be configured to open a shutter over the detector when substrate 32 is positioned over window 42.

Referring to FIGS. 3A–3C, in another embodiment, polishing sheet 14 includes a discrete region 60 that is at least semi-transparent (substantially transmissive) with respect to the light produced by monitoring system 22. Discrete region 60 may have a width of about 1 cm. This embodiment may be particularly advantageous for those systems in which polishing sheet 14 is formed from a material that is substantially opaque with respect to the light produced by monitoring system 22. For example, polishing sheet 14 may be formed of polyurethane with an additive (or have an open-cell structure or a grooved surface) that inhibits the transmission of laser beam 50, and discrete region 60 may be formed from polyurethane. As shown in FIG. 3B, a discrete region 62 may extend the length of polishing sheet 14. As shown in FIG. 3C, in another embodiment, a discrete region 64 may extend over only a limited length of polishing sheet 14. In this embodiment, monitoring system 22 is configured to periodically probe substrate 32 when discrete region 64 is aligned with window 42 in backing plate 40. Additional discrete regions 64 may be provided along the length of the central portion of sheet 14, if desired.

Referring to FIGS. 4A and 4B, in yet another embodiment, polishing surface 16 of polishing sheet 14 includes a plurality of projecting surface features 70 which may assist in polishing the surface of substrate 32. Surface features 70 may be arranged as a plurality of grooves or as a uniform array of protrusions. Surface features 70 may be formed from the same material as polishing sheet 14, or may be formed from a different material or include one or more additives (e.g., $CeO_2$ or alumina). As shown in FIG. 4A, surface features 70 may not significantly affect the transmission of beam 52 (e.g., the surface feature density may be sufficiently low, or the composition of surface features 70 is substantially transmissive to beams 50 and 52), enabling monitoring system 22 to probe substrate 32 without significant interference from surface features 70 (e.g., the signal to noise ratio is sufficiently high). Referring to FIG. 4B, if surface features 70 significantly affect the transmission of beams 50 and 52 (e.g., the surface feature density is too high, or the signal interference caused by each feature 70 is otherwise too great), one or more rows of surface features 70 may be removed over a region 72 to enable monitoring system 22 to probe substrate 32 without significant interference (e.g., the signal to noise ratio is sufficiently high). Region 72 may have a width of about 1 cm. In this embodiment, one or more rows of surface features 70 may be removed over the entire length of polishing sheet 14 (e.g., over a region corresponding to discrete region 62 of FIG. 3B), or only over a limited length region (e.g., over a region corresponding to discrete region 64 of FIG. 3C).

Other embodiments are within the scope of the claims. The invention may be implemented with other linear substrate polishing designs. For example, three or more rollers may be used to drive polishing sheet 14 and other additional features may be employed, as described in above-referenced U.S. Pat. No. 5,961,372. Polishing sheet 14 may be implemented in the form of a continuous belt as shown in FIG. 1A, or it may be implemented as a linear polishing sheet which is unwound from a roll of polishing material by a motor-driven take-up roller.

Still other embodiments are within the scope of the claims.

What is claimed is:

1. A polishing article for chemical mechanical polishing, comprising:
    a generally elongated polishing sheet having a polishing surface and formed from a material that is substantially opaque; and
    a discrete region extending substantially the length of the polishing sheet that is at least semi-transparent.

2. The polishing article of claim 1, wherein the polishing surface includes a plurality of projecting surface features disposed across the polishing surface with a substantially uniform spacing.

3. The polishing pad of claim 2, wherein the discrete region includes projecting surface features and wherein the spacing between adjacent features is greater in the discrete region than in the polishing surface.

4. The article of claim 2, wherein the discrete region lacks the projecting surface features.

5. The article of claim 1, wherein the polishing material includes polyurethane with an additive.

6. The article of claim 1, wherein the discrete region includes polyurethane.

7. The article of claim 1, wherein the polishing sheet includes a plurality of layers.

8. The article of claim 7, wherein the polishing sheet includes an covering layer and a backing layer.

9. The article of claim 8, wherein the covering layer comprises polyurethane having cells.

10. The article of claim 8, wherein the backing layer comprises fibers.

11. The article of claim 1, wherein the discrete region has a width of about 1 centimeter.

12. The article of claim 1, wherein the polishing sheet comprises a continuous belt.

13. The article of claim 1, wherein the polishing sheet comprises a linear sheet.

14. The article of claim 1, wherein the discrete region extends approximately down the center of the polishing sheet.

15. A polishing article for chemical mechanical polishing, comprising:
    a generally elongated polishing sheet having a polishing surface, the polishing surface having a plurality of projecting surface features disposed across the polishing surface with a substantially uniform first spacing; and
    a discrete region on the polishing surface in which the projecting surface features have a second spacing greater than the first spacing.

16. The article of claim 15, wherein the discrete region extends substantially the length of the polishing sheet.

17. The article of claim 15, wherein the polishing sheet comprises a continuous belt.

18. The article of claim 15, wherein the polishing sheet comprises a linear sheet.

19. A polishing article for chemical mechanical polishing, comprising:
    a generally elongated polishing sheet having a polishing surface, the polishing surface having a plurality of projecting surface features disposed across the polishing surface with a substantially uniform first spacing; and
    a discrete region on the polishing surface which lacks the projecting surface features.

20. The article of claim 19, wherein the discrete region extends substantially the length of the polishing sheet.

21. The article of claim 19, wherein the polishing sheet comprises a continuous belt.

22. The article of claim 19, wherein the polishing sheet comprises a linear sheet.

* * * * *